United States Patent
Lowrey et al.

(10) Patent No.: US 8,705,306 B2
(45) Date of Patent: *Apr. 22, 2014

(54) METHOD FOR USING A BIT SPECIFIC REFERENCE LEVEL TO READ A PHASE CHANGE MEMORY

(75) Inventors: Tyler Lowrey, West Augusta, VA (US); Ward D. Parkinson, Boise, ID (US); Ferdinando Bedeschi, Milan (IT); Claudio Resta, Pavia (IT); Roberto Gastaldi, Agrate Brianza (IT); Giulio Casagrande, Milan (IT)

(73) Assignee: Ovonyx, Inc., Sterling Heights, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/555,346

(22) Filed: Jul. 23, 2012

(65) Prior Publication Data

US 2012/0287698 A1 Nov. 15, 2012

Related U.S. Application Data

(62) Division of application No. 13/353,531, filed on Jan. 19, 2012, now Pat. No. 8,259,525, which is a division of application No. 11/093,877, filed on Mar. 30, 2005, now Pat. No. 8,116,159.

(51) Int. Cl.
*G11C 7/14* (2006.01)

(52) U.S. Cl.
USPC ............ 365/210.15; 365/210.14; 365/189.09; 365/194; 365/148; 365/163

(58) Field of Classification Search
USPC ................. 365/205, 190, 208, 207, 148, 163, 365/189.09, 225.7, 194, 210.14, 210.15, 365/210.1
See application file for complete search history.

(56) References Cited

U.S. PATENT DOCUMENTS

| | | | |
|---|---|---|---|
| 6,795,338 B2 | 9/2004 | Parkinson et al. | |
| 6,865,108 B2 * | 3/2005 | Smith et al. | 365/171 |
| 6,914,255 B2 | 7/2005 | Lowrey | |
| 6,982,909 B2 * | 1/2006 | Perner et al. | 365/189.07 |
| 7,154,774 B2 | 12/2006 | Bedeschi et al. | |
| 7,453,715 B2 * | 11/2008 | Parkinson | 365/148 |
| 7,495,944 B2 | 2/2009 | Parkinson et al. | |
| 7,570,524 B2 | 8/2009 | Bedeschi et al. | |
| 7,849,712 B2 * | 12/2010 | Parkinson | 65/148 |

(Continued)

FOREIGN PATENT DOCUMENTS

| | | |
|---|---|---|
| JP | 61045319 | 3/1986 |
| JP | 2002-8367 | 1/2002 |
| JP | 2004-515020 | 5/2004 |
| JP | 2005012186 | 1/2005 |

OTHER PUBLICATIONS

Japanese Patent Office, Office Action received for Japanese Patent Application No. 2006-90752, dated Nov. 29, 2011, 14 pages.

*Primary Examiner* — Andrew Q Tran
(74) *Attorney, Agent, or Firm* — Trop, Pruner & Hu, P.C.

(57) ABSTRACT

A voltage derived from accessing a selected bit using one read current may be utilized to read a selected bit of an untriggered phase change memory after the read current is changed. As a result, different reference voltages may be used to sense the state of more resistive versus a less resistive selected cells. The resulting read window or margin may be improved in some embodiments.

10 Claims, 3 Drawing Sheets

(56) References Cited

U.S. PATENT DOCUMENTS

| | | |
|---|---|---|
| 8,036,013 B2 | 10/2011 | Lowrey et al. |
| 8,116,159 B2 * | 2/2012 | Lowrey et al. ........... 365/210.15 |
| 8,259,525 B2 * | 9/2012 | Lowrey et al. ........... 365/210.15 |

* cited by examiner

METHOD FOR USING A BIT SPECIFIC REFERENCE LEVEL TO READ A PHASE CHANGE MEMORY

CROSS-REFERENCE TO RELATED APPLICATIONS

This application is a divisional of U.S. patent application Ser. No. 13/353,531, filed on Jan. 19, 2012, which is a divisional of U.S. patent application Ser. No. 11/093,877, filed on Mar. 30, 2005, which issued as U.S. Pat. No. 8,116,159.

BACKGROUND

This invention relates generally to semiconductor memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

Conventional sensing circuitry for thin film memories with an ovonic threshold switch (OTS) select switch and a memory element in series may use a fixed reference voltage or current that compares and discriminates cell state from the column voltage or current reached by accessing the cell. The read window is the voltage differential resulting, for example, from forcing current into a less resistive bit versus the voltage resulting from forcing current through a more resistive bit. The margin is basically determined by the worst case bit relative to (nearest) sense amp trip point within a group or block of cells. For example, a less resistive reset bit in series with a lower OTS hold voltage or a more resistive set bit in series with a higher OTS hold voltage may adversely affect the size of the read window, reducing margin, yield, and field reliability. Variation of threshold and hold voltages for the select device of the cells being read within a given group or block subtracts from the read window.

Thus, there is a need to make the read window or the read margin more independent of the bit-to-bit variations across a given array, group, or block of memory cells.

DETAILED DESCRIPTION

Figure 1:
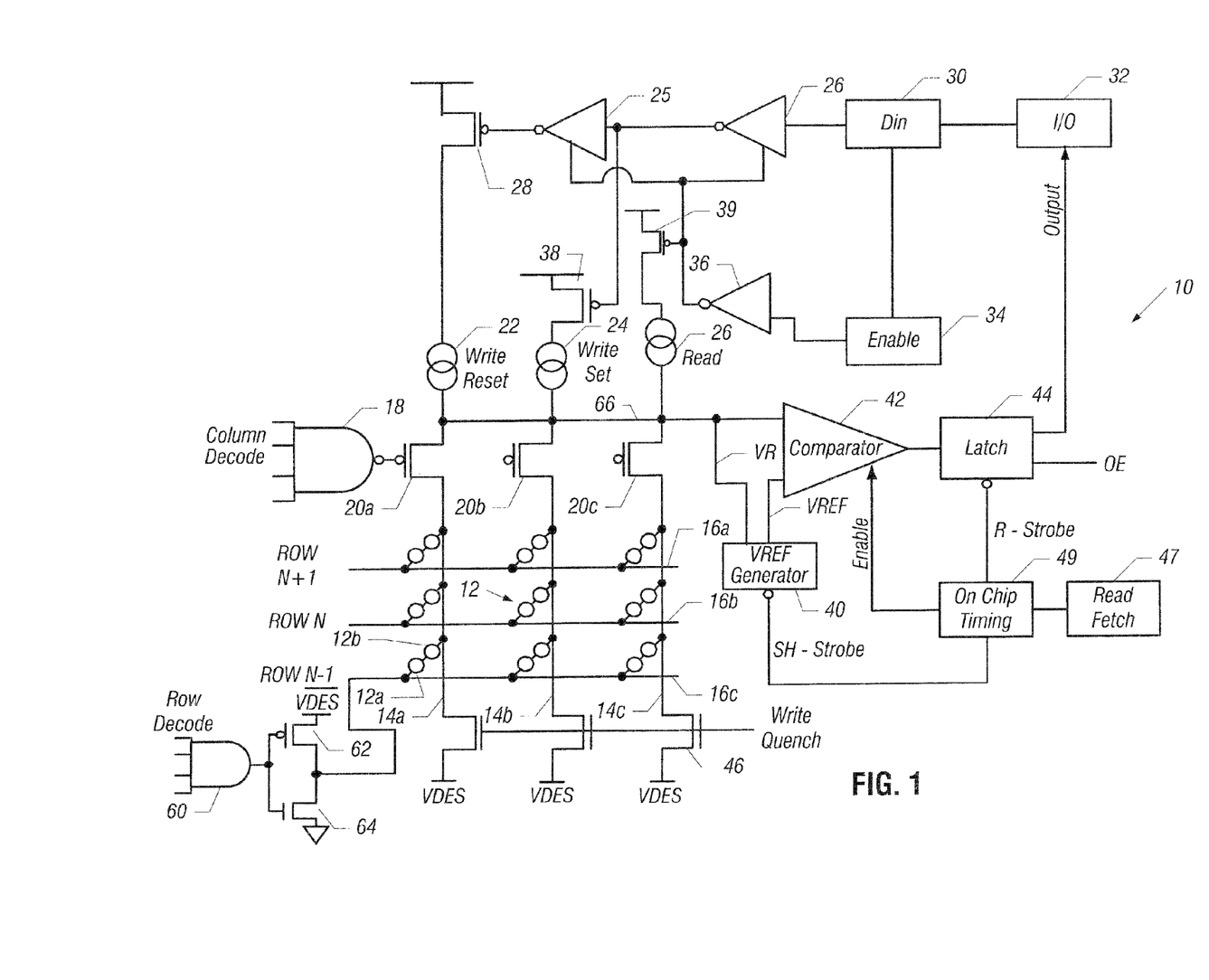
FIG. 1 is a circuit diagram for one embodiment of the present invention.

Referring to FIG. 1, a memory 10 may include an array of memory cells 12 arranged in rows 16 and columns 14 in accordance with one embodiment of the present invention. While a relatively small array is illustrated, the present invention is in no way limited to any particular size of an array. While the terms "rows" and "columns" are used herein, they are merely meant to be illustrative and are not limiting with respect to the type and style of the sensed array.

The cell 12 may be any memory cell including a phase change memory cell with a select device. Examples of phase change memory cells include those using chalcogenide memory cells 12b and threshold device 12a. A threshold device is an ovonic threshold switch that can be made of a chalcogenide alloy that does not exhibit an amorphous to crystalline phase change and which undergoes a rapid, electric field initiated change in electrical conductivity that persists only so long as the current flowing in the device exceeds the holding current of threshold device 12a.

In the case illustrated, a cell 12 includes an access, select, or threshold device 12a, as well as a memory sensing device 12b which stores one or more bits of data. A set of transistors 46 may be located on the columns 14 in order to enable write quenching and deselecting to VDES. A similar set of transistors may be located as well on the rows. The deselect voltage may be selected to be V/2 for both row and column. In the alternative, for better select voltage margin but increased standby leakage, the deselect column voltage may be V/3 and the row 2V/3, or variations thereof.

In one embodiment, the phase change material used in the sensing device 12b may be suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after the electrical power is removed.

In one embodiment, the phase change material may be chalcogenide element composition from the class of tellurium-germanium-antimony ($Te_xGe_ySb_z$) material or a GeSbTe alloy, such as 2,2,5, although the scope of the present invention is not limited to just these materials.

In one embodiment, if the memory material is a non-volatile, phase change material, the memory material may be programmed into one of at least two or more memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to a particular one of a number of resistance values within a range of resistance values to provide digital or analog storage of information. Use of more than four or more ranges of resistance may allow storing two or more logical bits per physical cell.

Programming of the memory material to alter the state or phase of the material may be accomplished by applying voltage potentials or forcing current to the lines 14, 16, thereby generating a voltage potential across the memory material. An electrical current may flow through a portion of the memory material in response to the applied voltage potentials or current forced, and may result in heating of the memory material.

This controlled heating and subsequent controlled cooling may alter the memory state or phase of the memory material. Altering the phase or state of the memory material may alter an electrical characteristic of the memory material. For example, resistance of the material may be altered by altering the phase of the memory material. Either all or a portion of the phase change memory material may be altered during the writing pulse (i.e. only a portion/region of sensing device 12*b* adjacent to either the top or bottom electrode may be phase changed during the write operation). In one embodiment, primarily the portion of memory material that undergoes phase change is the region that is adjacent to the smaller electrode. The memory material may also be referred to as a programmable resistance material or phase change memory.

In one embodiment, a voltage pulse or current forced with a potential difference of about 1.5 volts may be applied across a portion of the sensing device 12*b* by applying about 0 volts to a selected row line 16 and forcing about 2 ma into an column line 14 in response to a write command, such as from a processor. A current flowing through the memory material in response to the applied voltage potentials may result in heating of the memory material. This heating and subsequent cooling may alter the memory state or phase of the material.

In a "reset" state, the memory material may be in an amorphous or semi-amorphous state. In a "set" state, the memory material may be in a crystalline or semi-crystalline state. The resistance of the memory material in the amorphous or semi-amorphous state may be greater than the resistance of the material in the crystalline or semi-crystalline state. The association of reset (or 0) and set (or 1) with amorphous and crystalline states, respectively, is a convention. Other conventions may be adopted.

Due to electrical current, the memory material may be heated to a relatively higher temperature through application of a relatively higher write current such as 2 ma, and then subsequently cooled at a fast rate by turning off the current fast through use of a trailing edge that is, for example, less than 10 nsec, to amorphisize and "reset" the memory material. Heating the volume or memory material, by using a current of less than a reset current such as 2 ma, to cause a relatively lower crystallization temperature may crystallize and "set" the memory material. Alternately, better set states may result by using a current nearer the reset 2 ma value, and causing the trailing edge of the current pulse to decay to 30% or less of its peak value relatively slowly, such as in 500 nsec, before terminating the waveform rapidly.

Various resistances of memory material may be achieved to store information by varying the amount of current flow and duration through the volume of memory material, or by tailoring the edge rate of the trailing edge of the programming current or voltage pulse (to impact the cooling rate of the selected memory element). To assist terminating the reset current pulse faster and completing the fast portion of the trailing edge of the set current pulse, the transistors 46 may be activated to short the column to Vdes (and the row may be similarly deselected as well).

The information stored in the memory material may be read by measuring the resistance of the memory material. As an example, a read voltage with a read current compliance or a read current from a current source may be provided to the memory material using selected row and column lines 14 and 16, and a resulting read voltage across the memory material may be compared against a reference voltage using, for example, the comparator 42. The read voltage may be proportional to the resistance exhibited by the selected sensing device 12*b*.

In a low voltage or low field regime, the threshold device 12*a*, which may be an OTS (Ovonic Threshold Switch) or equivalent, is off and may exhibit very high resistance in some embodiments. The off resistance can, for example, range from 50,000 ohms to greater than 10 gigaohms at a bias of half the threshold voltage.

The device 12*a* may remain in its off state until voltage across it exceeds a threshold voltage or until a threshold current through the device 12*a* switches or "triggers" it to a highly conductive, low resistance on state. This "on" state is in series with a $V_H$ holding voltage, such as one volt, a state that persists while greater than an Ihold ($I_H$) flows through the device. $I_H$(ots) may be adjusted through chalcogenide or electrode composition and size to be less than $I_{TH}$(ots) of device 12*a* to reduce oscillations after triggering on if driven by a high impedance current source.

After turn-on or triggering, the voltage across the device 12*a* drops to a lower voltage, called the holding voltage $V_H$ and remains very close to this holding voltage, almost regardless of current flowing since the dynamic resistance is very low and frequently less than 1000 ohms (now in series with its holding voltage $V_H$). In one embodiment of the present invention, as an example, the threshold voltage may be on the order of 3 volts and the holding voltage may be on the order of 2.7 volts. This higher $V_H$ of device 12*a* that is close to $V_{TH}$ of device 12*a* may use one or more OTS select devices 12*a*, in series in each memory cell (bit), each device 12*a* in series having $V_H$ of about 0.9V and $V_{TH}$ of about 1V.

After thresholding or triggering, by more than $I_{TH}$ passing through select device 12*a*, the voltage across the element will decrease or snapback from its $V_{TH}$ (such as 3V) to its holding voltage ($V_H$), such as 2.7V. Reduced snapback, here for example 0.3V, is desirable to be sure the snapback does not exceed $V_{TH}$(oum) of the sensing device 12*b*. Otherwise, more snapback voltage will trigger on (threshold) the oum memory and tend to disturb its state with repeated reads due to capacitive displacement current.

After passing through the snapback region, in the on state, the device 12*a* voltage drop remains close to the holding voltage as the current passing through the device is increased, even if up to a relatively high, current level. Above a very high current level, the device remains on but may display a finite and increasing dynamic resistance with the voltage drop also increasing with increasing current. The device 12*a* may remain on until the current through the device 12*a* is reduced below a characteristic holding current value that is dependent on the area and composition of the select device 12*a* material and its top and bottom electrodes utilized to form the device 12*a*.

In some embodiments of the present invention, the threshold device 12*a* does not change phase. It remains permanently amorphous and its current-voltage characteristics may remain the same throughout its operating life.

As an example, for a 0.2 micrometer diameter device 12a with 700 Angstrom thickness formed of TeAsGeSSe having respective atomic percents of 16/13/15/1/55, the holding current for sub-micron devices may be on the order of 0.1 to 1 micro-amps (uA) in one embodiment. Below this holding current, the device 12a turns off and returns to the high resistance regime at low voltage, low field.

The threshold current for the device 12a may generally be higher but of the same order as the holding current. The holding current may be altered by changing process variables, such as the top and bottom electrode material and the chalcogenide material. The device 12a may provide high "on current" with relatively low dV/dI resistance once triggered on for a given area of device compared to conventional access devices such as metal oxide semiconductor field effect transistors or bipolar junction transistors or semiconductor diodes. However, such other devices may also be used in some embodiments, such as in embedded memory applications where minimum process change is desired, since the memory occupies a relatively smaller portion of the chip.

A decoder 18 receives address signals to select the desired column using transistor 20 associated with each column. A reset write current source 22, a set write current source 24, and a read current source 26 are coupled to the common decoded node 66, and hence to a selected column, such as column 14c in this example. Of course, the current sources in actual practice would be coupled to selected columns as needed in response to commands from an external memory user such as a processor. Also provided are common integrated circuit functions such as power and ground, timing signals, and pumped voltages.

Transistors 28 and 38 and 39 are on/off switches that select the desired current, generated by current sources 22, 24, or 26, to the selected column 14. A gate 36 provides a control circuit for the transistor 39 enabling the read current source 26. The gate 36 is driven by an enable circuit 34, controlled and initiated by on-chip timing 49 as well as commands from off-chip, such as from an external processor.

The output from gate 36 also provides an enable for Din gates 25 and 26 that, during a write cycle, enable write current sources 22 or 24 by turning on transistor 28 or 38. Current source 22 has a higher current (such as 2 ma) with a fast trailing edge rate, such as less than 10 nsec. The current source 24 either has a lower current or a slow trailing edge (for example, greater than 500 nsec) that turns off the write current pulse at the close of the write cycle. An input/output control 32 is coupled to the Din circuit 30 which drives the Din gates 30 to determine which state is written to the selected cell.

The sense amplifier, in the form of a comparator 42 in one embodiment shown in FIG. 1, receives one input from a selected column such as 14c voltage being read, and a second input, VREF, from reference voltage generator 40. The comparator 42 or reference voltage generator 40 may be provided on each column 14 in other embodiments, but may (as shown), be shared across an array of column lines to minimize related layout area.

The reference voltage generator 40 receives a voltage VR from the selected column 14. Using this input, reference voltage generator 40 generates an output voltage VREF to the other comparator 42 input. The reference voltage generator 40 is strobed by a sample and hold (SH) strobe to trap the volumn voltage VR at the appropriate time t3 in FIG. 3C. The output from the comparator 42 drives data output latch 44, and may provide an output enable (OE) signal to indicate when the output can be driven (Ready/Busy signal). Or, OE may be conventionally furnished by the processor to enable the output bus driver.

The read fetch cycle is started by the equivalent of a read fetch signal, often conventionally furnished by a processor in one of several forms. For example, a read cycle may be initiated if Write is high and one or more addresses change if an address transition detector senses the incoming address pins. Otherwise, read may be initiated by asserting a read fetch clock input signal.

The data output signal on I/O from the latch 44 is enabled by a read (R) strobe. An externally furnished OE, such as from a processor, may enable output drive if data in and out are shared on the same I/O pin.

Data in the memory cell is accessed by a selected row 16 going low and the selected column 14 being driven high enough by the read current source 26 to trigger the cell threshold device 12a. In other embodiments, such as those using inverted voltages and p-channel transistors exchanged for n-channel transistors, the direction and relative polarity of signals may be changed. Alternately, the select device may be, for example, an n-channel transistor or bipolar diode with appropriate adjustment in the row select signal.

Figure 2:
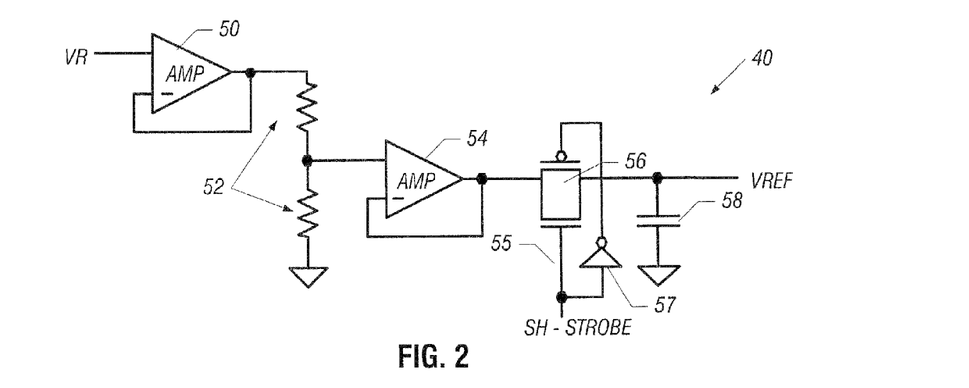
FIG. 2 is a circuit diagram for the voltage reference generator shown in FIG. 1 in accordance with one embodiment of the present invention.

The generator 40 in FIG. 2 receives a reference signal voltage VR from the selected column 14, so that the reference signal may basically track the column voltage, offset by a voltage translation generated by the resistor divider 52. The selected column voltage is buffered by a first amplifier 50 and a second amplifier 54. Both amplifiers 50 and 54 may be unity gain amplifiers. The amplifier 54 receives its voltage from resistor divider 52. While a resistor divider is shown, other voltage dividers may be used including a capacitor divider for reduced power and better layout efficiency.

Figure 3A:
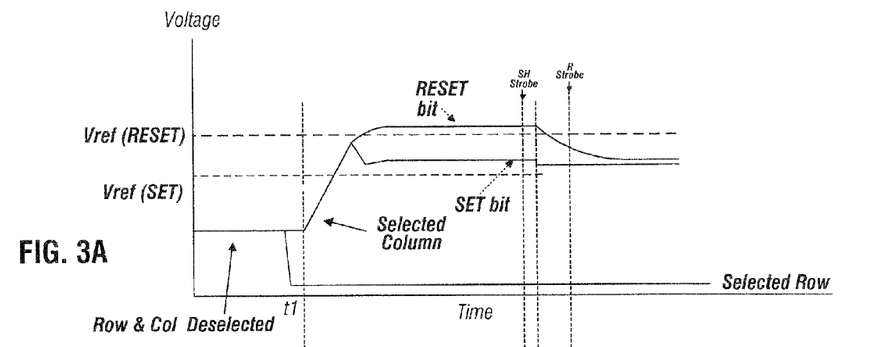
FIG. 3A is a plot of voltage versus for a selected column in accordance with one embodiment of the present invention.
Figure 3B:
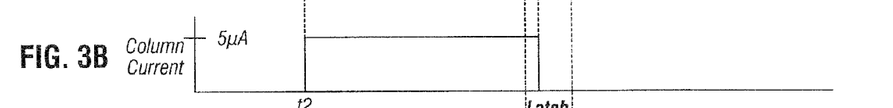
FIG. 3B is the column current for the selected column versus time in accordance with one embodiment of the present invention.
Figure 3C:
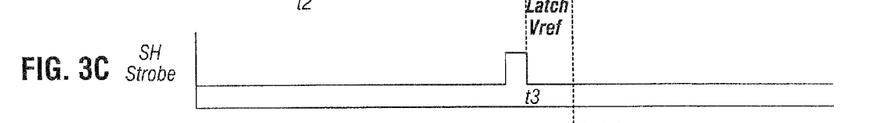
FIG. 3C is a plot of the sample and hold strobe voltage versus time in accordance with one embodiment of the present invention.

A multiplexer 56 composed of an n-channel transistor 57 in parallel with a p-channel transistor 56 is controlled by the sample and hold (SH) strobe signal, with timing as shown in FIG. 3C. To hold the level from amplifier 54, SH strobe closes the multiplexer at time t3 and traps a voltage on capacitor 58, a voltage stored for subsequent comparison to the column at a later time. In one embodiment, the capacitor 58 may be 0.001 microfarads for storing the reference voltage signal without significant decay for the time necessary to generate the compared column voltage after read current is changed. For comparison to this later column voltage, VREF may be stored for about 200 nanoseconds in one embodiment.

This same function may also be done by a more sophisticated sample and hold or other circuit alternatives. For example, some applications may use an analog-to-digital converter with digital storage that drives a digital-to-analog converter for generating a stored voltage used for comparison to the later column voltage after the read current is changed. While in digital form, an arithmetic unit may cause the appropriate reduction in voltage to discriminate data state(s) in the memory cells. Similar techniques may be used to generate additional reference levels for storing more than one logical bit per physical cell, as is apparent to one reasonably skilled in the art.

Figure 3D:
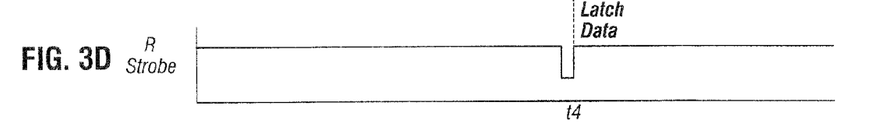
FIG. 3D is a depiction of the R strobe latch voltage versus time in accordance with one embodiment of the present invention.

The R strobe signal in FIG. 3D determines when the voltage comparison of the later column voltage to the sampled and held reference voltage level is valid, so data is latched by R Strobe. Here, for example, Set bit voltage changes rapidly after the read current is reduced or turned off where as the Reset bit voltage decays slowly from its Vfinal achieved from forcing the read current. Accordingly, R Strobe at t4 is adjusted so that the reset bit has adequate time to decay well below the Vref (Reset) generated and stored by the Voltage generator 40 at time t3.

Referring to FIG. 3A, the column voltage level over time is shown for a selected column and row in accordance with one hypothetical embodiment. In standby or when deselected, the column voltages are approximately equal to V/2 or Vdes, where V is related to the threshold voltages of the devices 12a and 12b, and may be adjusted die to die or block to block within a die for improved margin against improperly triggering a device 12a which is not selected (while another is selected). For example, V/2 may be 2V if the threshold voltage of device 12a is typically 3V with $V_H$(ots) of 2.5V, and the threshold voltage of device 12b is typically 1V with a $V_H$(oum) of 0.5V.

While the selected column voltage goes high, the selected row voltage may go low (unless the select device is an N-channel MOS transistor where the row line selected may go high). For example, in an embodiment where the select device 12a is an OTS select device, the selected row 16 has an initially high deselect voltage which falls to a steady low select voltage as indicated in FIG. 3A, a low voltage set by the row select driver and ground drop driving the current selected by transistors 28, 38, and 39. The deselected column 14 has a relatively low deselect voltage, and the column voltage increases as the column is selected by forcing current into the selected column. The column current forced during read is indicated in FIG. 3B. Upon application to the selected column, the read current forces the selected column voltage to rise as the column is selected.

The read column current amplitude is set to be above the threshold current of the threshold device 12a so it triggers on and allows accessing the resistance level (the memory information stored) in memory element 12b. Tread is preferably less than the threshold current of the memory element 12b. For read currents less than Ith of the memory element 12b that may threshold on the memory element, the need to refresh the memory cell 12 is minimized. One or more repeated reads with currents through memory element 12b in excess of its $I_{TH}$ can cause a reset bit to either be misread as a set bit or degrade its resistance, and either may cause a misread or read disturb error.

FIG. 3A shows the row being selected low and plots the selected column voltage when reading the set bit (lower waveform after 12a triggers) and reset bit (upper waveform) states of a given memory cell with the same read current. The read current is forced long enough to allow a steady state voltage (Vfinal) to develop for a bit in both a set or reset state (region t3). Latch Vref is asserted at t3 to store this resulting column voltage generated from accessing the memory cell with a read current after triggering its select device. The level stored is the column voltage translated down by about 0.25V by the VREF generator shown in FIG. 2. SH Strobe assertion is shown accessing the output level from Amp 54 in FIG. 2 (rising edge of SH strobe) and then trapping the level (trailing edge at t3), in FIG. 3C. In some applications, adequate margin can be developed without waiting this long for Vfinal, as will be apparent to those reasonably skilled in the art, enabling use of faster Read timing.

The reset bit generates for later comparison a higher reference voltage ($V_{ref}$(Reset)) than the voltage sampled and held at t3 for a set bit ($V_{ref}$(Set)). The voltage of a reset bit goes higher and has more voltage across it because the read current times the higher resistance produces a higher voltage (added to Vhots). The resulting higher reference voltage (top horizontal dashed line in FIG. 3A) generated and stored at t3 by accessing a reset bit may be utilized for reading the reset bit, and similarly the lower reference voltage generated for the set bit (lower horizontal dashed line in FIG. 3A) may be used for later comparison to the column at time t4 to read a set bit.

Moreover, because the reference voltage may be generated bit by bit by sampling and holding the reference voltage from the selected column, row, and bit, the reference voltage (VR) is a function of the selected column, row, and cell characteristics. The resulting reference voltage (less a chosen offset voltage) includes Iread×Rcell of 12b (a function of cell state) plus the holding voltage $V_H$ of the select device 12a (which can vary bit to bit) plus Iread×(Rrow select device+Rrow line+Rcol line)+Vground line (at the row select device). By generating a reference that tracks the $V_H$ of the device 12a as well as other array variables and drivers, substantial variation may be eliminated by setting the reference, bit by bit, for the specific bit read on each read cycle.

Then, once the final value is reached before t3, sampled at t3, and held, the read current is reduced (or turned off) and a new resulting column voltage is sensed and compared by Comparator 42 relative to the bit specific reference voltage stored earlier by the circuit of FIG. 2 as Vref. Thus, variation in $V_H$ bit to bit or cycle to cycle does not reduce read window margin because it is in effect subtracted from both the reference voltage stored earlier at higher read current and the column voltage sampled later at reduced read current. Similarly, the effect on read margin may be minimized due to row to row variation in the select voltage from driver on resistance, position on the row and column line, and from ground voltage distribution differences array to array.

The reference voltage (Vref) may be generated in another embodiment, where the row voltage is not pulled all the way to ground (to minimize row leakage to deselected columns), or where the row voltage goes high when selected (because the cell select device is an N-channel MOS transistor, for example). Other variations are also possible, such as use of a bipolar or MOS diode or transistor as the select device.

As shown in FIG. 3C, the sample and hold strobe (SH Strobe) latches the translated reference voltage near the time when the reset bit is at its highest level (near Vfinal), just before the column current is reduced or cut off. The reference voltage is then stored in the capacitor 58 for a period of time, such as 200 nanoseconds, for comparison to the column after allowing adequate change in the column voltage from changing the current.

After the column current is changed or turned off, the set bit voltage decreases only slightly (since the voltage across the memory is less with lower resistance). The reset bit voltage falls more in voltage, as shown in FIG. 3A, and slower (because the RC time constant is larger). After a period time, such as 200 nanoseconds, the reset column eventually falls near to the voltage of a set bit. The read data is latched at a time, t4, after the t3 time when the reference voltage is latched and after the read current is reduced or turned off, as indicated in FIGS. 3B, 3C and 3D. This read data latch time may be approximately one or more RC time constants, such as 200 nanoseconds, after latching Vref and reducing the column current, in one embodiment of the present invention.

If the read current is reduced to zero, the R Strobe time is more critical since the latching may be preferably done before the current through the selected set device 12a falls below $I_H$, and thus too much deterioration in the Set Bit voltage is avoided. Otherwise, if the current is reduced but kept above the select device 12a holding current ($I_H$), then the time allowed can be more sufficient to allow the voltage of a reset (higher resistance) bit to fall well below the reference, while avoiding critical timing relative to a set bit. Too much decrease in the voltage of the set bit through a decrease in voltage across the threshold device 12a is avoided by maintaining current in the select device above $I_H$(ots). However, read delay may be improved if the current is reduced to zero, with adequate margin preserved by reducing the delay before latching data at t4. For either case, the current may be reduced or turned off at time equal to or shortly after t3; that is, once the reference level Vref is latched.

Referring back to FIG. 2, a reference voltage is passed to the storage capacitor 58 at the t3 time indicated in FIG. 3C, when the Vref voltage is latched near the peak of reset bit voltage. The comparison for the reset bit, which occurs after latching the reference voltage, reducing the read current, and waiting a delay time for the column to fall adequately below the stored offset reference, indicates whether the voltage is less than the (reset) reference voltage. In contrast, the comparison for a set bit state indicates whether the later column voltage with reduced current remains higher than the (lower) set reference voltage Vref as indicated in FIG. 3A for the lower waveform which stays above its Vref (SET). This comparison is done by the sense amplifier 42 (FIG. 1) in accordance with one embodiment of the present invention after the column current has been reduced after t3 (FIG. 3A).

While the divider 52 is shown as providing the offset, such as 0.25 volts, from the actual column voltage sensed at Latch Vref time t3, other alternatives may be utilized for providing this offset as well—even providing an adequate built-in amplifier offset in the comparator 42 and then simply trapping the peak bit line voltage at SH Strobe time without offsetting it with resistor divider 52 in FIG. 2. VREF offset, relative to the column voltage at the time of sampling, needs to be more than Iread×Rset and less than Iread×Rreset, and approximately equal to the average of the two, as will be apparent to those reasonably skilled in the art. Either the offset voltage or read current or both may be adjusted on each chip to optimize read voltage margin.

Preferably, the population of bits is scanned at the factory and the offset adjusted in the reference voltage generator 40 by on or more of several possible techniques. The resistor divider may be "programmed" into the chip by adjusting one resistor relative to the other in this divider, such as with laser fuse repair. The offset in the reference voltage should be relatively well centered so as to optimize read margin for the variation in bit voltage due to deterioration, temperature, and voltage variation. Preferably, the reference offset is adjusted block by block for larger size memories with more than one block on a chip, or even within segments of the block in larger blocks.

In some embodiments, the column is first charged (precharged) to a voltage forced by a voltage driver or an initially higher read current, but the voltage is limited to be less than that necessary to trigger select device 12a (so less than $V_{TH}$ min (12a)) and then the techniques described above continued are continued from this initially higher column voltage. By such pre-charging in combination with the embodiments herein, the read delay may be reduced.

Alternatively, in a multi-bit scheme that stores more than one logical bit per physical cell, multiple reference voltages can be generated and stored in a similar fashion to the single translated voltage Vref described herein. The additional voltages may differ in the amount of offset relative to the Vfinal sensed at t3 in FIG. 3. Then, varying resistance levels may be written in the sensing device 12b by using different programming current amplitudes, width, or trailng edge.

Use of a binary search and multiple writes with feedback by reading between each write attempt will result in more precise writing of the desired resistance. By such techniques, more than one bit per cell or analog signals may be stored using techniques apparent to those skilled in the art, even though the techniques described herein are for one bit per cell.

Upon reducing current at time t3, a set bit declines in voltage less than a reset bit (FIG. 3A), so that a set bit voltage is high relative to the reference voltage after a decay period with the current reduced or off. Similarly, a reset bit may be less than the reference voltage after one or more RC time constants, determined where R is the reset bit resistance and C is the column capacitance. The timeout delay until strobing at t4 may be set for the reset bit decay rate, since it is slower than for a set bit.

For avoiding read disturb, the column current may be set to be greater than the threshold current of the threshold device 12a to assure bit selection and less than the threshold current of the memory portion 12b. The threshold current of device 12a may be engineered to be less than the threshold current of memory device 12b. The read current may be chosen to be less than the threshold current of the memory element 12b to avoid triggering a reset bit into the dv/di state and to avoid degrading the resistance of the selected bit within the reset state.

Higher read currents may result in faster charging and improved delay in completing the read cycle, but at the risk of exceeding the threshold current of the selected cell memory element 12b. In more elaborate read schemes with more risk on precise timing, higher read currents may be used that are closer to or slightly greater than the threshold current of the device 12b, but the timing to sense/latch the reference voltage Vref may be adjusted so the current is reduced before the voltage across sensing device 12b is exceeded.

More precise timing may be done using a derivative rate of change sensor that creates a voltage proportional to the rate of change in the column. By sensing the peak rate of change during the initial portion of charging the column (between t1 and triggering select device 12a), the peak may be compared for change that occurs when 12a thresholds. Thereafter, the timeout to t3 may be initiated from when 12a tghresholds (instead of starting the timing from t2) for better precision.

Figure 4:
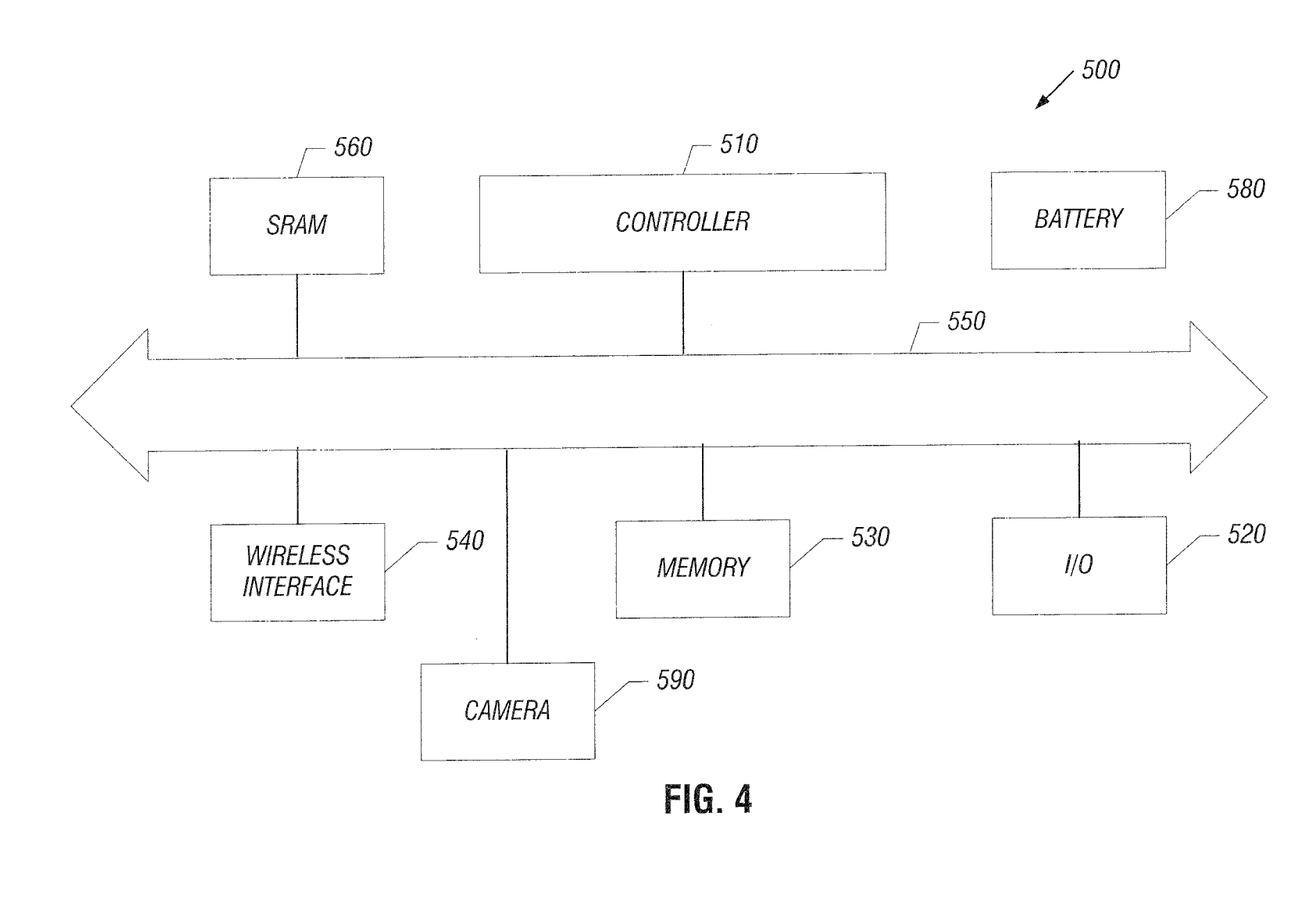
FIG. 4 is a system depiction according to one embodiment of the present invention.

Turning to FIG. 4, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or memory 10 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored). The system may store camera images, either downloaded or uploaded wirelessly, or generated and stored directly in the memory described herein from a camera 590.

While an example in a wireless application is provided above, embodiments of the present invention may also be used in non-wireless applications as well.

What is claimed is:

1. A method comprising:
   reading a cell on an addressed cell line of a memory by developing a reference level from the addressed line; and comparing a reference voltage, generated before a read current to the addressed line is changed, to a voltage generated on the addressed line after the read current is changed.

2. The method of claim 1 including providing different reference levels to detect higher and lower resistance cells.

3. The method of claim 1 including offsetting the reference level from said addressed line.

4. The method of claim 1 including using a reference level derived from a voltage on the addressed line.

5. The method of claim 1 including sensing whether a level on the addressed line is above or below the reference level.

6. The method of claim 1 including storing said reference level from the addressed line for comparison to a level on said addressed line at a later time.

7. The method of claim 6 including comparing said levels after changing a current in the addressed line.

8. The method of claim 6 including comparing said levels after changing the read current into the addressed line.

9. The method of claim 1 including using a higher reference voltage to sense a cell in its higher resistance state and using a lower reference voltage to sense a cell in its lower resistance state.

10. The method of claim 1 including using a read current greater than the threshold current of a threshold device and less than the threshold current of the cell.

* * * * *